United States Patent
Hibino

(10) Patent No.: US 6,764,960 B2
(45) Date of Patent: Jul. 20, 2004

(54) MANUFACTURE OF COMPOSITE OXIDE FILM AND MAGNETIC TUNNELING JUNCTION ELEMENT HAVING THIN COMPOSITE OXIDE FILM

(75) Inventor: Satoshi Hibino, Hamakita (JP)

(73) Assignee: Yamaha Corp. (JP)

( * ) Notice: Subject to any disclaimer, the term of this patent is extended or adjusted under 35 U.S.C. 154(b) by 9 days.

(21) Appl. No.: 10/022,598

(22) Filed: Dec. 17, 2001

(65) Prior Publication Data

US 2002/0076940 A1 Jun. 20, 2002

(30) Foreign Application Priority Data

Dec. 20, 2000 (JP) ........................................ 2000-386449

(51) Int. Cl.$^7$ ........................ H01L 21/31; H01L 21/469
(52) U.S. Cl. ........................................ 438/768; 438/770
(58) Field of Search ................................ 438/768, 770

(56) References Cited

U.S. PATENT DOCUMENTS

| | | |
|---|---|---|
| 4,828,370 A | 5/1989 | Suzuki |
| 5,055,319 A | 10/1991 | Bunshah et al. |
| 5,986,858 A | 11/1999 | Sato et al. |
| 6,331,944 B1 | 12/2001 | Monsma et al. |
| 6,528,814 B1 | 3/2003 | Frank et al. |
| 6,555,889 B2 | 4/2003 | Hiramoto et al. |
| 6,586,797 B2 | 7/2003 | Forbes et al. |

FOREIGN PATENT DOCUMENTS

| | | |
|---|---|---|
| JP | 55-15950 | 2/1980 |
| JP | 2000-36628 | 2/2000 |
| JP | 2000-91668 | 3/2000 |
| JP | 2000-251229 | 9/2000 |

OTHER PUBLICATIONS

Japanese Office Action issued Aug. 19, 2003 (w/ English translation).

Primary Examiner—Richard Elms
Assistant Examiner—Beth E. Owens
(74) Attorney, Agent, or Firm—Dickstein, Shapiro, Morin & Oshinsky, LLP.

(57) ABSTRACT

An aluminium film is formed by sputtering on a ferromagnetic layer made of, e.g., Ni—Fe alloy. The aluminum film is oxidized while an alumina film is deposited on the aluminum film by reactive sputtering, to form a tunneling barrier film. Assuming that the aluminum film has a thickness of 1 nm and the alumina film deposited has a thickness of 0.2 nm, an alumina film having a thickness of about 1.5 nm is formed on the ferromagnetic layer, this alumina film being a lamination of an alumina film which is the oxidized aluminum film and the deposited alumina film. The surface of the ferromagnetic layer is prevented from being oxidized because of the presence of the aluminum film. A thin oxide film such as alumina can be formed in a short time without oxidizing an underlying layer.

20 Claims, 6 Drawing Sheets

MANUFACTURE OF COMPOSITE OXIDE FILM AND MAGNETIC TUNNELING JUNCTION ELEMENT HAVING THIN COMPOSITE OXIDE FILM

CROSS REFERENCE TO RELATED APPLICATION

This application is based on and claims priority on Japanese patent application 2000-386449, filed on Dec. 20, 2000, the whole contents of which are incorporated herein by reference.

BACKGROUND OF THE INVENTION

A) Field of the Invention

The present invention relates to a method of forming an oxide film such as alumina (aluminum oxide) and a method of manufacturing a magnetic tunneling junction element by using the oxide film forming method.

B) Description of the Related Art

Magnetic tunneling junction elements are known as megnetoresistive elements to be used for magnetic heads, magnetic memories, magnetic sensors and the like. As a magnetic tunneling junction element manufacture method, a method as illustrated in FIGS. 10 to 12 is known (e.g., JP-A-2000-91668).

In the process illustrated in FIG. 10, on the surface of a ferromagnetic layer 1 made of Fe or the like, an aluminum film 2 of 2 nm in thickness is formed by sputtering. Next, pure oxygen is introduced into a sputtering chamber, and the aluminum layer 2 is oxidized for 10 minutes by setting an oxygen pressure in a range from 20 mTorr to 200 Torr. An alumina film 3 is therefore formed on the surface of the aluminum film 2 as shown in FIG. 11. This alumina film 3 is used as a tunneling barrier film. Thereafter, in the process illustrated in FIG. 12, a ferromagnetic layer 4 made of Co—Fe alloy or the like is formed on the alumina film 3 by sputtering.

As a method of forming an alumina film as a tunneling barrier film, other methods are also known, including (a) a method of exposing an aluminum film in the air to make it subject to natural or native oxidation and (b) a method of subjecting an aluminum film to a plasma oxidation process (for the method (a), refer to JP-2000-91668, and for the method (b), refer to JP-2000-36628).

With the conventional method (b), oxidation becomes likely to be too excessive so that an underlying ferromagnetic layer may be oxidized at the interface with the tunneling barrier film and the variation in a magnetic tunneling resistance may become lower.

With the conventional method (a), it takes a long time, several hours, to complete the oxidation process so that the tunneling barrier film may be formed with pin holes or contaminated by the presence of dusts in the air and the film quality may be degraded.

Although the method illustrated in FIGS. 10 to 12 is an improved version of the method (a), an aluminum film 2 not oxidized is likely to remain under the aluminum film 3 as shown in FIG. 11. The remaining aluminum film 2 lowers the variation in the magnetic tunneling resistance. If oxidation of the aluminum film is insufficient, the electrostatic breakdown voltage of the magnetic tunneling junction lowers and the time-dependent change in the variation in the magnetic tunneling resistance becomes large when the magnetic tunneling junction element is placed in a high temperature environment. For these reasons, the reliability of a magnetic tunneling junction element lowers.

SUMMARY OF THE INVENTION

It is an object of the present invention to provide a novel method of manufacturing an oxide film capable of forming a thin oxide film in a short time without oxidizing an underlying layer.

It is another object of the invention to provide a novel method of manufacturing a magnetic tunneling junction element capable of improving the variation in a magnetic tunneling resistance, the electrostatic breakdown voltage, reliability and productivity of the tunneling junction element.

According to one aspect of the present invention, there is provided a method of forming an oxide film comprising the steps of: forming a conductive film by depositing conductive material on an underlying layer capable of being oxidized; and oxidizing the conductive film while oxide of the conductive material is deposited on the conductive film by reactive sputtering in an oxidizing atmosphere, to form a composite oxide film on the underlying layer, the composite oxide film including a first oxide film which is the oxidized conductive film and a second oxide film made of the deposited oxide.

According to this method of forming the oxide film, after a conductive film is formed by depositing conductive material on an underlying layer capable of being oxidized, the conductive film is oxidized while oxide of the conductive material is deposited on the conductive film by reactive sputtering in an oxidizing atmosphere. Accordingly, oxidation of the underlying layer can be prevented because of the presence of the conductive film, and oxidation of the conductive film is suppressed more as the oxide of the conductive material deposited becomes thicker. Namely, the conductive film is not positively subjected to the oxidation process, but the phenomenon is utilized by which phenomenon the conductive film is oxidized while the oxide of the conductive material is deposited on the conductive film by reactive sputtering in an oxidizing atmosphere. Therefore, by optimizing a ratio of the thickness of the conductive film to the thickness of the second oxide film, oxidation can be stopped just at the interface between the underlying layer and conductive film. For example, by setting the thickness of the second oxide film to the thickness required for completely oxidizing the conductive film, it is possible to oxidize only the conductive film and prevent the underlying layer from being oxidized.

According to this method of forming the oxide film, during the reactive sputtering in the oxidizing atmosphere, oxygen plasma reacts also with the conductive film so that the conductive film can be oxidized sufficiently even at a low temperature. The composite oxide film of a good quality can be formed which has the first oxide film of the oxidized conductive film and the second oxide film of the deposited oxide. Since the sputtering process is used, a thin oxide film can be formed in a short time.

In the method of forming a oxide film, as the conductive material, metal such as aluminum, titanium and magnesium or semiconductor such as silicon can be used.

According to another aspect of the present invention, there is provided a method of manufacturing a magnetic tunneling junction element comprising the steps of: forming a conductive film by depositing conductive material on a first ferromagnetic layer capable of being oxidized; oxidizing the conductive film while oxide of the conductive material is deposited on the conductive film by reactive sputtering in an oxidizing atmosphere, to form as a tunneling barrier film a composite oxide film on the first ferromagnetic layer, the composite oxide film including a first oxide film which is the oxidized conductive film and a second oxide film made of the deposited oxide; and forming a second ferromagnetic layer on the tunneling barrier film, the second ferromagnetic layer facing the first ferromagnetic layer.

With this method of manufacturing a magnetic tunneling junction element, the tunneling barrier film of the magnetic tunneling junction element is formed by employing the above-described method of forming an oxide film. Since the tunneling barrier film made of the first and second oxide films can be formed by oxidizing only the conductive film without oxidizing the first ferromagnetic layer, variation in the magnetic tunneling resistance can be improved. Since an oxide film of a good quality to be used as the tunneling barrier layer can be formed in a short time, the electrostatic breakdown voltage, reliability and productivity of magnetic tunneling junction elements can be improved.

As above, an oxide film of a good quality can be formed on the underlying layer in a short time without oxidizing the underlying layer.

The oxide film to be used as the tunneling barrier film formed by the method of forming an oxide film improves the variation in magnetic tunneling resistance, electrostatic breakdown voltage, reliability and productivity.

DESCRIPTION OF THE PREFERRED EMBODIMENTS

Figure 1:
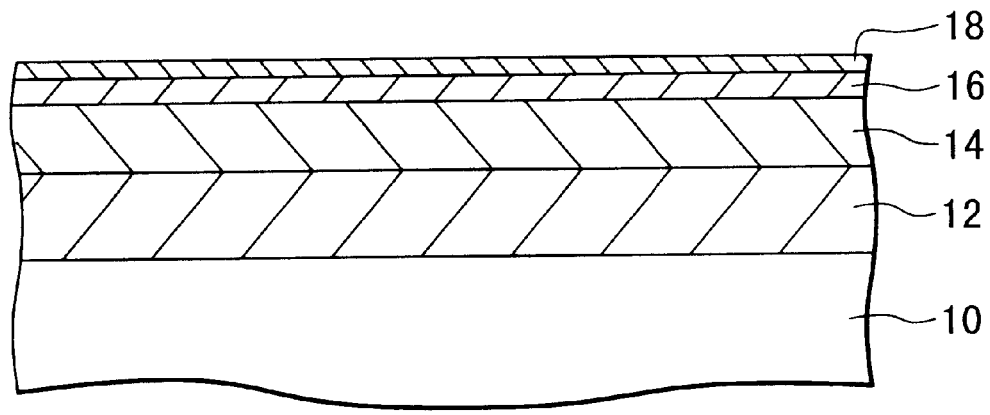
FIG. 1 is a cross sectional view of a substrate illustrating an aluminum film forming process in a method of manufacturing a magnetic tunneling junction element according to an embodiment of the invention.
Figure 2:
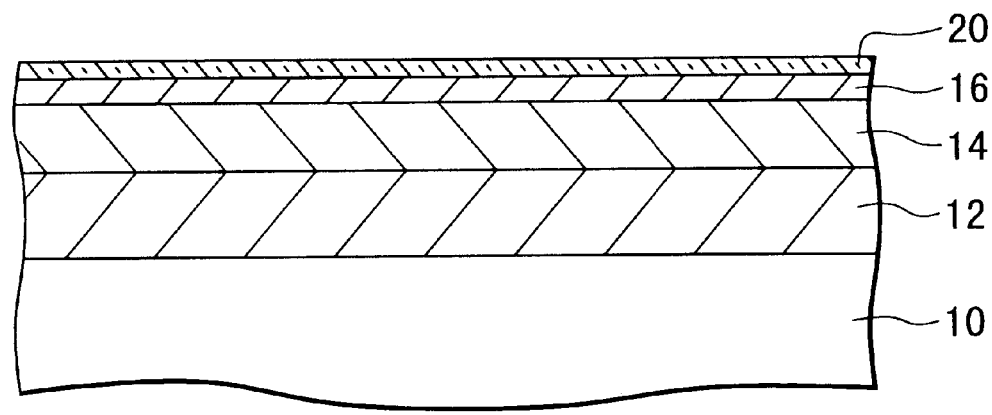
FIG. 2 is a cross sectional view of the substrate illustrating an alumina film forming process following the process illustrated in FIG. 1.

FIGS. 1 to 6 illustrate a method of manufacturing a magnetic tunneling junction element according to an embodiment of the invention.

Processes (1) to (6) corresponding to FIGS. 1 to 6 will be described in this order.

(1) A substrate 10 is prepared which is a silicon substrate having a thermally oxidized insulating silicon oxide film on the surface of the substrate. As the substrate 10, a substrate made of glass or quartz may also be used.

(2) On the surface of the substrate 10, an electrode layer 12 is formed which is made of a Ti layer having a thickness of 15 nm and a Cu layer having a thickness of 300 nm sequentially formed by sputtering. The electrode layer 12 is not limited to a lamination of the Cu layer stacked upon the Ti layer. For example, it may be a single layer made of Cr or Ti. Next, an antiferromagnetic layer 14 is formed on the electrode layer 12 by sputtering, the antiferromagnetic layer 14 being made of a Pt—Mn alloy layer having a thickness of 50 nm. Instead of Pt—Mn alloy, other materials such as Rh—Mn alloy and Fe—Mn alloy may be used as the material of the antiferromagnetic layer 14.

A ferromagnetic layer 16 is formed on the antiferromagnetic layer 14 by sputtering, the ferromagnetic layer 16 being made of a Ni—Fe alloy layer having a thickness of 6 nm. Instead of Ni—Fe alloy, other metal such as Ni, Fe, or Co, other alloy or intermetallic compound of two or more metals among Ni, Fe and Co, or other material may also be used.

Next, an aluminum film 18 is formed on the ferromagnetic layer 16 by sputtering. For example, the thickness of the aluminum film 18 is 0.3 to 2 nm. In forming the aluminum film 18, a pure aluminum target is used. The sputtering conditions are, for example:

Ar gas pressure: 8 mTorr
DC power: 100 W
Substrate Temperature: room temperature
Film Forming Time: 10 sec.

(2) An alumina film 20 is formed on the ferromagnetic layer 16 through deposition of an alumina film and oxidation of the aluminum film. For example, In the same sputtering chamber as that in which the aluminum film 18 was formed, the supply of Ar gas is stopped and then $O_2$ gas is introduced. In this oxidizing atmosphere, an alumina film is formed by reactive sputtering. The thickness of the deposited alumina film is, for example, 0.1 to 0.5 nm. In this case, the pure aluminum target used for the aluminum film 18 is used. The sputtering conditions are, for example:

$O_2$ gas pressure: 8 mTorr
DC power: 100 W
Substrate Temperature: room temperature
Film Forming Time: 10 sec.

Under these conditions, the aluminum film 20 having a uniform thickness can be formed, and the thickness of the alumina film 20 becomes 0.5 to 2.5 nm.

Figure 9A:
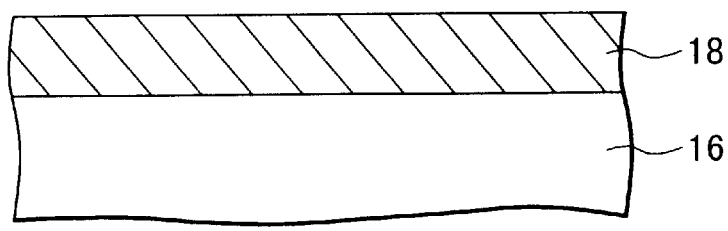
FIGS. 9A to 9C are cross sectional views illustrating a progress of oxidation in an aluminum film 18.
Figure 9B:
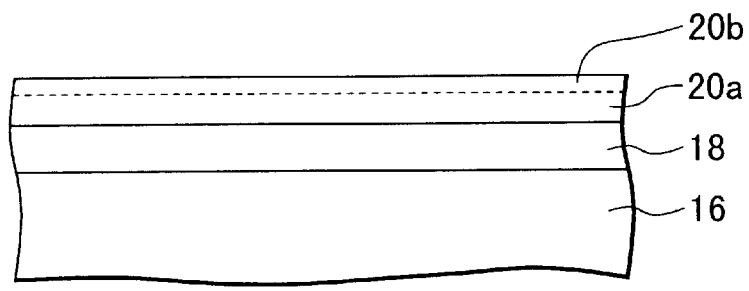
Figure 9C:
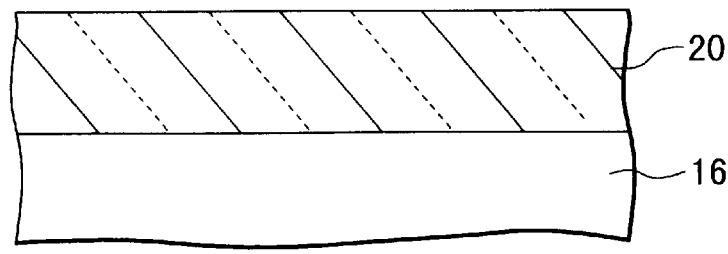
Figure 10:
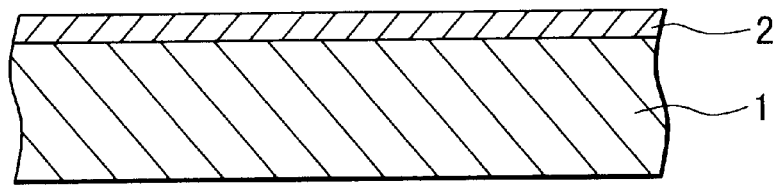
FIG. 10 is a cross sectional view illustrating an aluminum film forming process in a conventional method of manufacturing a magnetic tunneling junction element.
Figure 11:
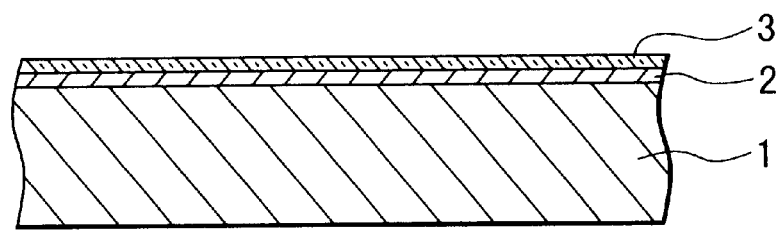
FIG. 11 is a cross sectional view illustrating an alumina film forming process following the process shown in FIG. 10.
Figure 12:
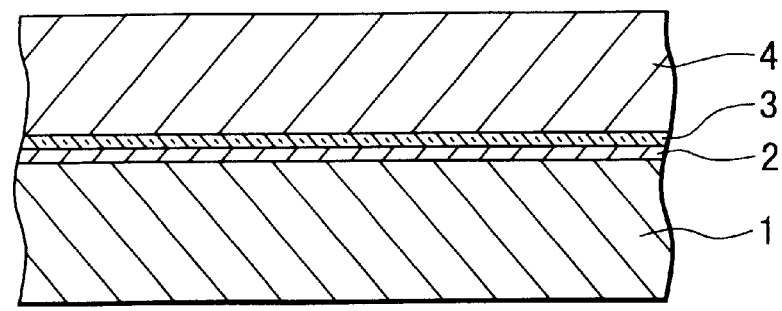
FIG. 12 is a cross sectional view illustrating an ferromagnetic layer forming process following the process shown in FIG. 11.

FIGS. 9A to 9C are diagrams illustrating the progress of oxidation in the aluminum film 18. After the aluminum film 18 is formed on the ferromagnetic film 16 by sputtering as shown in FIG. 9A, an alumina film 20b is formed by reactive sputtering as shown in FIG. 9B. In this case, the aluminum film 18 is oxidized by the presence of $O_2$ gas and the function of $O_2$ plasma during the reactive sputtering process, and transformed into an alumina film 20a. Therefore, the alumina film 20 obtained after the completion of the reactive sputtering process contains the alumina film made by oxidizing the whole thickness of the aluminum film 18 without leaving the aluminum film, as shown in FIG. 9C. By setting the thickness of the second alumina film 20b to the thickness required for completely oxidizing just the whole thickness of the aluminum film 18, it is possible to oxidize only the aluminum film 18 and prevent the oxidation of the ferromagnetic layer 16. The thickness of the aluminum film 18 is usually 1 to 2 nm. The thickness of the second alumina film 20b is set to the thickness required for completely oxidizing the aluminum film 18 having such a thickness. However, it is practically difficult to completely oxidize the aluminum layer 18 and not to oxidize the ferromagnetic layer 16 at all. If a film structure regarded effectively as such a structure can be obtained, it can be said that the whole thickness of the conductive layer is substantially oxidized and the ferromagnetic layer is not substantially oxidized. The reactive sputtering process may be performed in another sputtering chamber different from the sputtering chamber used for the previous sputtering process.

(3) Next, a ferromagnetic layer 22 is formed on the alumina film 20 by sputtering, the ferromagnetic layer 22 being made of an Ni—Fe alloy layer having a thickness of 80 nm. Instead of Ni—Fe alloy, the ferromagnetic layer 22 may be made of other ferromagnetic materials similar to those previously described for the ferromagnetic layer 16.

(4) Next, the lamination from the electrode layer 12 to the ferromagnetic layer 22 is patterned by an ion milling process using as a mask a resist pattern having a pattern which is the same as a predetermined lower electrode pattern. A lower electrode layer 12A made of the residual electrode layer 12 is therefore formed. Thereafter, the resist pattern is removed.

Figure 4:
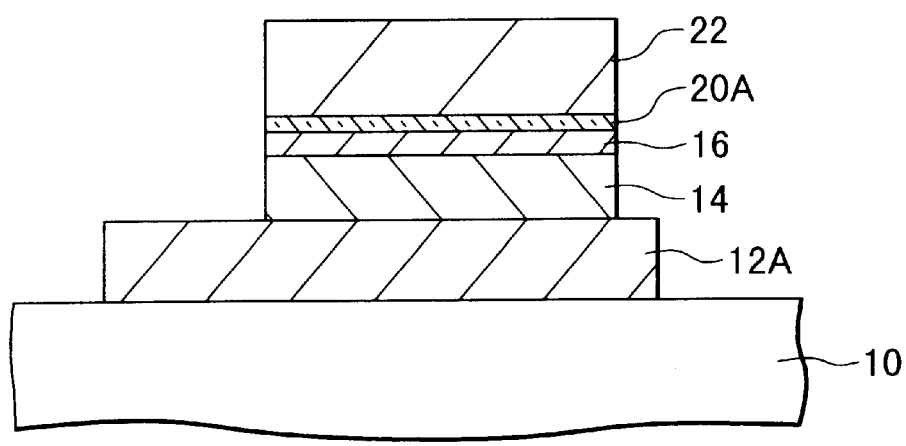
FIG. 4 is a cross sectional view of the substrate illustrating an ion milling process following the process illustrated in FIG. 3.

Next, the lamination from the antiferromagnetic layer 14 to the ferromagnetic layer 22 is patterned by an ion milling process using as a mask a predetermined resist pattern. On the electrode layer 12A, a lamination which is made of the antiferromagnetic layer 14, ferromagnetic layer 16, alumina film 20A and ferromagnetic layer 22 is therefore left, as shown in FIG. 4. Thereafter, the resist pattern is removed. The alumina film 20A is used as a tunneling barrier film.

(5) Next, the ferromagnetic layer 22 is patterned by an ion milling process using a resist pattern having a pattern same as a predetermined element pattern. On the tunneling barrier film 20A, the ferromagnetic layer 22 having a plan shape of, e.g., a longer side length of 120 $\mu$m and a shorter side length of 20 $\mu$m is therefore left. Thereafter, the resist pattern is removed.

(6) An interlayer insulating film 24 is formed over the substrate 10 by sputtering, the interlayer insulating material made of a silicon oxide film having a thickness of 1000 nm. A contact hole exposing a partial area of the ferromagnetic layer 22 is formed through the insulating film 24 by ion milling process using a resist mask pattern. This resist mask pattern is thereafter removed. Then, an electrode layer is formed over the insulating film 24, the electrode layer being made of a copper layer having a thickness of 300 nm. This copper layer is patterned to have a predetermined upper electrode pattern so that an upper electrode layer 26 connected to the ferromagnetic layer 22 can be formed.

Figure 5:
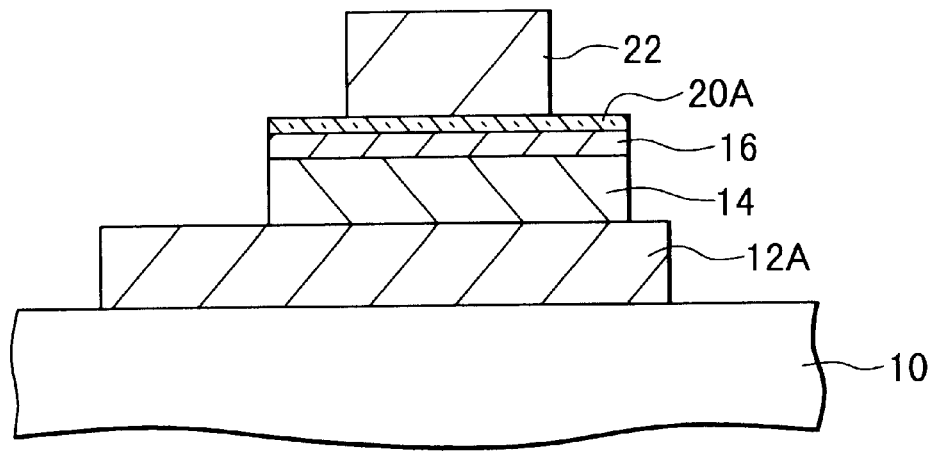
FIG. 5 is a cross sectional view of the substrate illustrating an ion milling process following the process illustrated in FIG. 4.
Figure 6:
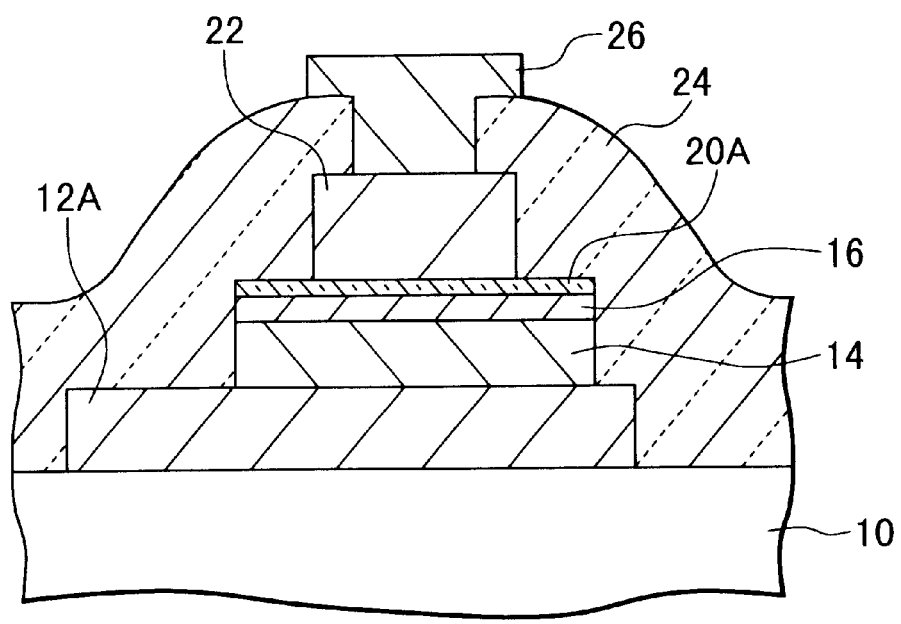
FIG. 6 is a cross sectional view of the substrate illustrating an insulating film forming process and an electrode layer forming process following the process illustrated in FIG. 5.

In the embodiment described above, although the shape of the ferromagnetic layer 22 is decided at the process shown in FIG. 5, carried out after the process shown in FIG. 4, the process shown in FIG. 6 may be performed directly after the process of FIG. 4, omitting the process shown in FIG. 5. In this case, the final shape of the ferromagnetic layer 22 is the same as the shape of the ferromagnetic layer 22 shown in FIG. 4. In the magnetic tunneling junction element shown in FIG. 6, the antiferromagnetic layer 14 functions to fix the magnetization direction of the ferromagnetic layer 16, and the ferromagnetic layer 16 becomes a fixed layer. The ferromagnetic layer 22 has a free magnetization direction (not fixed) and becomes a free layer.

In the state that a predetermined current is allowed to flow between the electrode layers 12A and 26, as an external magnetic field is applied to the inner plane of the ferromagnetic layer 22, a relative magnetization angle between the ferromagnetic layers 16 and 22 changes with the direction and intensity of the applied magnetic field, and the electric resistance between the electrode layers 12A and 26 changes with a change in the relative magnetization angle. The resistance value becomes minimum if the magnetization directions are parallel, and maximum if they are antiparallel. Therefore, a magnetic field can be detected from a change in the resistance value.

Figure 7:
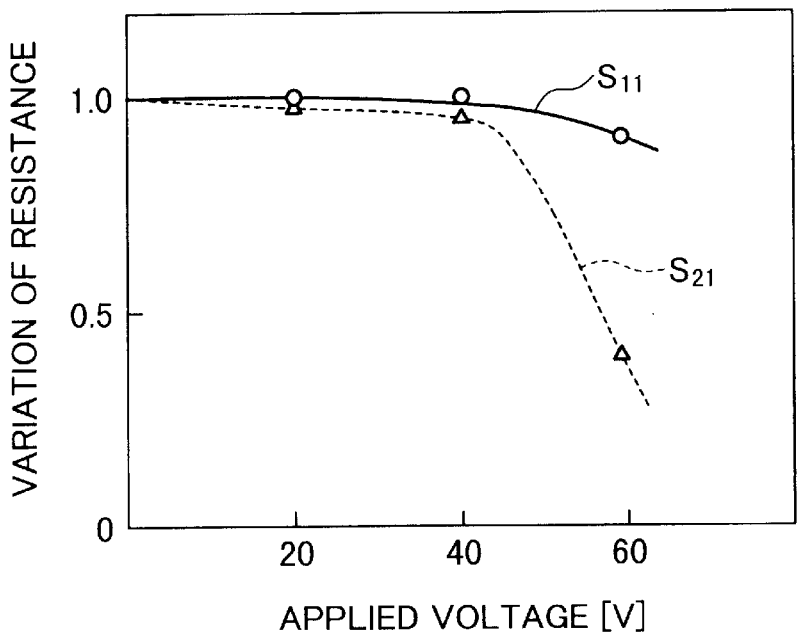
FIG. 7 is a graph showing electrostatic breakdown voltage characteristics of an embodiment magnetic tunneling junction element and a conventional magnetic tunneling junction element.

FIG. 7 is a graph showing electrostatic breakdown voltage characteristics of an embodiment magnetic tunneling element and a conventional magnetic tunneling element. The embodiment magnetic tunneling junction element was manufactured by a method similar to that illustrated in FIGS. 1 to 6 (the shape of the ferromagnetic layer 22 decided by the process shown in FIG. 4 was used and the process shown in FIG. 5 was omitted). The conventional magnetic tunneling junction element was manufactured by the similar method used for the embodiment magnetic tunneling junction element, excepting that the tunneling barrier film (corresponding to the film 20A shown in FIG. 4) was formed by a natural oxidation method (exposing the aluminum film to the air).

In FIG. 7, the abscissa represents a voltage (V) applied across a pair of electrode layers (12A and 26 in FIG. 6), and the ordinate represents a rate of change in the electric resistance between the pair of electrode layers. Curves $S_{11}$ and $S_{21}$ also indicate the electrostatic breakdown voltage characteristics of the embodiment and conventional magnetic tunneling junction elements, respectively. As seen from FIG. 7, it can be understood that the embodiment magnetic tunneling junction element has a higher electrostatic breakdown voltage than the conventional magnetic tunneling junction element.

Figure 8:
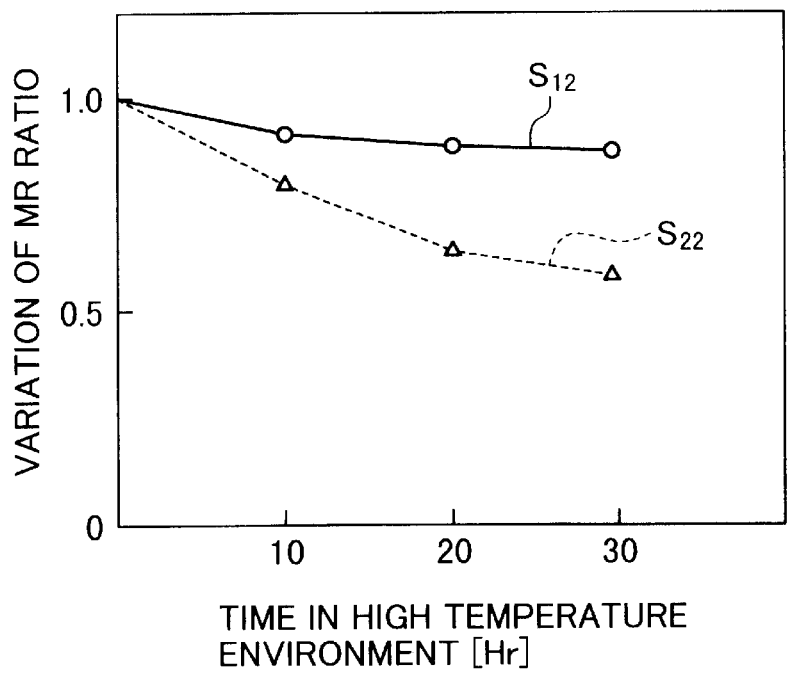
FIG. 8 is a graph showing time-dependent variation in the characteristics of MR ratios magnetic tunneling junction element of an embodiment and a conventional magnetic tunneling junction element when they are placed in a high temperature environment.

FIG. 8 is a graph showing the time-dependent change of an MR ratio of the embodiment and conventional magnetic tunneling junction elements when they are placed in an environment of a high temperature of 280° C. The magnetic tunneling junction elements used for the measurement of the characteristics are similar to those described with reference to FIG. 7. An MR ratio is a ratio of the maximum magnetic tunneling resistance to the minimum magnetic tunneling resistance. Curves $S_{12}$ and $S_{22}$ indicate the time-dependent change characteristics of the embodiment and conventional magnetic tunneling junction elements, respectively. As seen from FIG. 8, it can be understood that the embodiment magnetic tunneling junction element has a smaller time-dependent change in the MR ratio and a higher reliability than the conventional magnetic tunneling junction element.

The times required for forming the tunneling barrier film of the embodiment and conventional magnetic tunneling junction elements were compared. It took two minutes per one substrate (wafer) for the embodiment element, and it took 180 minutes per one substrate for the conventional element. The magnetic tunneling junction elements used for the comparison were similar to those described with reference to FIG. 7. The time taken to form the tunneling barrier film of the embodiment element includes the time taken to form the aluminum film and alumina film as well at the time taken to place the substrate inside and outside a sputtering chamber. The embodiment manufacture method can shorten greatly the time taken to form the tunneling barrier film and improve the productivity.

Figure 3:
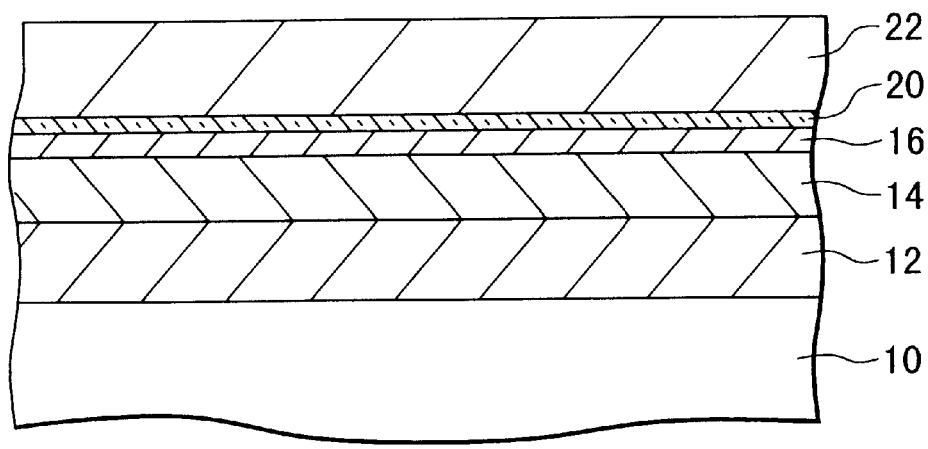
FIG. 3 is a cross sectional view of the substrate illustrating a ferromagnetic layer forming process following the process illustrated in FIG. 2.

The present invention has been described in connection with the preferred embodiments. The invention is not limited only to the above embodiments. It will be apparent to those skilled in the art that various modifications, improvements, combinations, and the like can be made. For example, the following modifications are possible:

(1) After the ferromagnetic layer 22 is formed in the process shown in FIG. 3, a conductive film having an anti-etching performance such as Mo may be formed on the ferromagnetic layer 22. In this case, it is possible to prevent the ferromagnetic layer 22 from being etched when the contact hole is formed through the insulating film 24 by selective etching in the process shown in FIG. 6.

(2) The ferromagnetic layer 22 is not limited only to a single layer structure, but it may be a multi-layer structure, e.g., a Co layer of 2 nm in thickness formed under a Ni—Fe alloy layer.

(3) The antiferromagnetic layer 14 may be formed on the upper ferromagnetic layer 22, to make the ferromagnetic layer 22 a fixed layer and make the ferromagnetic layer 16 a free layer.

(4) The material of the tunneling barrier layer 20A may be metal oxide or semiconductor oxide (e.g., $TiO_x$, $SiO_2$, MgO, $Al_2O_3+SiO_2$ (sialon)), metal nitride or semiconductor nitride (AlN, $Si_3N_4$), metal oxynitride or semiconductor oxynitride (AlN—$Al_2O_3$) or the like.

(5) Although Cu, Ti, Cr or the like is used as the material of the electrode layer 12A, conductive and non-magnetic metal material such as W, Ta, Au and Mo may also be used. These metal materials may also be used as the material of the electrode layer 26.

I claim:

1. A method of forming an oxide film comprising the steps of:
    forming a conductive film on an underlying layer capable of being oxidized by depositing conductive material thereon; and
    oxidizing the conductive film while oxide of the conductive material is deposited on the conductive film by reactive sputtering in an oxidizing atmosphere, to form a composite oxide film on the underlying layer, the composite oxide film including a first oxide film which is the oxidized conductive film and a second oxide film made of the deposited oxide.

2. The method according to claim 1, further comprising:
    forming a lower electrode layer on a substrate before the conductive film is formed, the conductive film being formed on the lower electrode layer.

3. The method according to claim 2, wherein the oxidizing step oxidizes substantially the whole thickness of the conductive film and minimally oxidizes the lower electrode layer.

4. The method of claim 3, wherein the conductive layer is an aluminum layer and the reactive sputtering is performed in a atmosphere containing oxygen.

5. The method according to claim 3, further comprises selectively removing the layers at levels higher than the lower electrode layer outside an active area to expose a partial area of the lower electrode layer.

6. The method of claim 1, wherein the conductive layer is an aluminum layer and the reactive sputtering is performed in a atmosphere containing oxygen.

7. A method of manufacturing a magnetic tunneling junction element comprising the steps of:
    (a) forming a conductive film on a first ferromagnetic layer capable of being oxidized by depositing conductive material thereon;
    (b) oxidizing the conductive film while oxide of the conductive material is deposited on the conductive film by reactive sputtering in an oxidizing atmosphere, to form as a tunneling barrier film a composite oxide film on the first ferromagnetic layer, the composite oxide film including a first oxide film which is the oxidized conductive film and a second oxide film made of the deposited oxide; and
    (c) forming a second ferromagnetic layer on the tunneling barrier film, the second ferromagnetic layer facing the first ferromagnetic layer.

8. The method according to claim 7, further comprising before said step (a), the steps of:
    (x) forming a lower electrode layer on a substrate; and
    (y) forming the first ferromagnetic layer on the lower electrode layer.

9. The method according to claim 8, wherein said step (b) oxidizes substantially the whole thickness of the conductive layer and oxidizes minimally the first ferromagnetic layer.

10. The method according to claim 9, wherein the conductive layer is an aluminum layer and the reactive sputtering is performed in an atmosphere containing oxygen.

11. The method according to claim 9, further comprising the step of:
    (d) selectively removing the layers at levels higher than the lower electrode layer outside an active area to expose a partial area of the lower electrode layer.

12. The method according to claim 11, further comprising before said step (y), the step of:
    (e) forming an antiferromagnetic layer in contact with the first ferromagnetic layer.

13. The method according to claim 12, further comprising the steps of:
    (f) forming an insulating layer covering the second ferromagnetic layer;
    (g) forming an opening through the insulating layer to expose a partial area of the second ferromagnetic layer; and
    (h) forming an upper electrode layer in contact with the second ferromagnetic layer via the opening.

14. The method according to claim 11, further comprising after said step (c), the step of:
    (d') forming an antiferromagnetic layer on the second ferromagnetic layer.

15. The method according to claim 14, further comprising the steps of:
    (e') forming an insulating layer covering the antiferromagnetic layer;
    (f') forming an opening through the insulating layer to expose a partial area of the antiferromagnetic layer; and
    (g') forming an upper electrode layer in contact with the antiferromagnetic layer via the opening.

16. A method of forming an oxide film, comprising:
    sputtering a first conductive material capable of being oxidized, on an underlying layer capable of being oxidized, thereby forming a first conductive film;

sputtering a second conductive material capable of being oxidized in an oxidizing atmosphere, thereby depositing a first oxide film of said second conductive material, while allowing oxidization of said first conductive film to form a second oxide film.

17. The method of forming an oxide film according to claim 16, wherein said underlying layer is formed of a first ferromagnetic film.

18. The method of forming an oxide film according to claim 17, further comprising the step of:

sputtering a second ferromagnetic film on said first oxide film; and patterning a laminate including said second ferromagnetic film, said first oxide film, said second oxide film, and said first ferromagnetic film, thereby forming a magnetic tunneling function element.

19. A method of forming a magnetic tunneling junction element, comprising the steps of:

sputtering a first conductive material capable of being oxidized, on a first ferromagnetic film capable of being oxidized, thereby forming a first conductive film;

sputtering a second conductive material capable of being oxidized in an oxidizing atmosphere, thereby depositing a first oxide film of said second conductive material, while allowing oxidization of said first conductive film to form a second oxide film; and sputtering a second ferromagnetic film on said first oxide film.

20. The method of forming a magnetic tunneling junction element according to claim 19, further comprising the step of:

patterning a laminate including said second ferromagnetic film, said first oxide film, said second oxide film, and said first ferromagnetic film.

* * * * *